(12) United States Patent
Lee

(10) Patent No.: US 7,892,967 B2
(45) Date of Patent: Feb. 22, 2011

(54) SEMICONDUCTOR DEVICE AND METHOD FOR MANUFACTURING THE SAME

(75) Inventor: Byung-Ho Lee, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/511,444

(22) Filed: Jul. 29, 2009

(65) Prior Publication Data

US 2010/0025851 A1   Feb. 4, 2010

(30) Foreign Application Priority Data

Jul. 29, 2008   (KR) .................... 10-2008-0073984

(51) Int. Cl.
*H01L 21/4763* (2006.01)

(52) U.S. Cl. ............ 438/637; 436/618; 436/622; 436/687; 257/E21.575; 257/E21.577; 257/E21.585

(58) Field of Classification Search ............. 438/403, 438/408
See application file for complete search history.

(56) References Cited

U.S. PATENT DOCUMENTS

| 2007/0117348 A1* | 5/2007 | Ramanathan et al. | 438/455 |
| 2007/0128847 A1* | 6/2007 | Hong | 438/624 |
| 2008/0182405 A1* | 7/2008 | Liu et al. | 438/623 |

* cited by examiner

*Primary Examiner*—Charles D Garber
*Assistant Examiner*—Cheung Lee
(74) *Attorney, Agent, or Firm*—Sherr & Vaughn, PLLC

(57) ABSTRACT

A semiconductor device and a method for manufacturing the same include forming a second copper-plated layer over a second IMD layer and inside a second aperture formed in the second IMD by an electroplating process that uses the exposed first copper-plated layer as a seed layer. With the method, the copper-plated layer may be more simply and rapidly formed and achieve superior gap filling characteristics.

18 Claims, 4 Drawing Sheets

FIB. 2C

SEMICONDUCTOR DEVICE AND METHOD FOR MANUFACTURING THE SAME

The present application claims priority under 35 U.S.C. §119 to Korean Patent Application No. 10-2008-0073984, filed on Jul. 29, 2008, which is hereby incorporated by reference in its entirety.

BACKGROUND

As devices are progressively decreasing in size due to technical developments, use of metal such as aluminum (Al) during processing may cause numerous problems. Some more serious problems include a short-channel effect during a front-end process and an RC time constant delay during a Back-End-Of-the-Line (BEOL) process. To minimize the short-channel effect, optimization attempts for new device schematics, various ion implantation methods, junction depth fine control, etc. have been made. In addition, to minimize the RC time constant delay, attempts for the use of low dielectric constant materials, copper (Cu) interconnection, etc. have been made. In particular, electroplating methods have been frequently used for copper interconnection due to a simplified through-put process. Electroplating methods entail depositing copper ions on a wafer edge by the application of an electric field. To adopt the electroplating methods, a conductor material, e.g., a copper seed layer must be present on the wafer edge.

Figure 1:
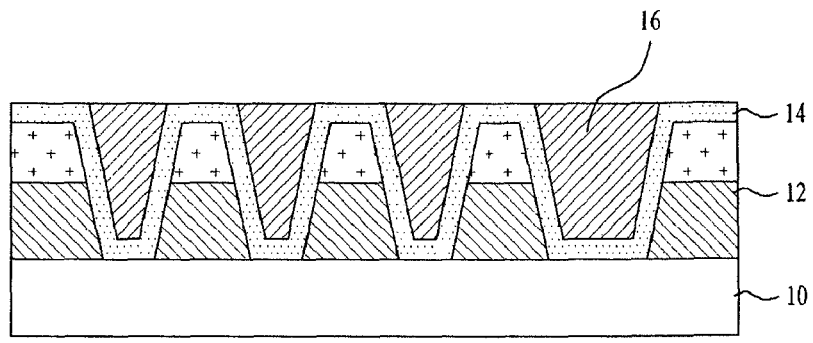

FIG. 1 illustrates a sectional view of a semiconductor device that includes inter metal dielectric (IMD) layer 12 formed on and/or over a semiconductor substrate or lower metal line 10. IMD layer 12 may have via-holes or contact-holes provided therein. Anti-diffusion layer 14 is formed on and/or over IMD layer 12 and inside the via-holes and, in turn, copper-plated layer 16 is formed on and/or over the anti-diffusion layer 14. For example, a copper seed layer may be formed on and/or over anti-diffusion layer 14 and then copper-plated layer 16 may be formed using the copper seed layer by an electroplating process.

In the case of the semiconductor device including a plurality of layers vertically stacked one above another as illustrated in FIG. 1, it is troublesome to deposit a copper seed layer using a separate process to form copper-plated layer 16 on a per layer basis. Further, since via-holes and trenches, in which the copper-plated layer will be buried, are decreasing in size due to rapid technical development, the gap-filling capability of the copper-plated layer has its limitations.

SUMMARY

Embodiments are related to a semiconductor device and a method for manufacturing the same that forms a copper-plated layer using a fast, yet simple electroplating process to achieve enhanced gap-filling characteristics.

In accordance with embodiments, a method may include at least one of the following: forming at least one first inter metal dielectric (IMD) layer on and/or over a semiconductor substrate; and then forming a first aperture in the first IMD layer; and then forming a first copper-plated layer on and/or over the first IMD layer and inside the first aperture; and then forming at least one second IMD layer on and/or over the first copper-plated layer; and then forming a second aperture in the second IMD layer to expose the first copper-plated layer; and then forming a second copper-plated layer on and/or over the second IMD layer and inside the second aperture by an electroplating process that uses the exposed first copper-plated layer as a seed layer.

In accordance with embodiments, a method for manufacturing a semiconductor device may include at least one of the following: forming a lower inter metal dielectric (IMD) layer over a semiconductor substrate; and then forming a lower damascene structure in the first IMD layer to expose the semiconductor substrate; and then forming a lower metal-diffusion-preventing layer over the uppermost surface of the lower IMD layer, the uppermost surface of the semiconductor substrate and sidewalls of the lower damascene structure; and then forming a lower copper-plated layer over the lower metal-diffusion-preventing layer and filling the lower damascene structure; and then planarizing the lower copper-plated layer such that a portion of the lower copper-plated layer has a predetermined thickness over the uppermost surface of the lower IMD layer; and then forming an upper IMD layer over the planarized lower copper-plated layer; and then forming an upper damascene structure in the upper IMD layer to expose the lower copper-plated layer; and then forming an upper metal-diffusion-preventing layer over the uppermost surface of the upper IMD layer and sidewalls of the upper damascene structure such that a portion of the uppermost surface of the lower copper-plated layer corresponding to the upper damascene structure is exposed; and then forming an upper copper-plated layer over the upper IMD layer and filling the upper damascene structure by performing an electroplating process using the exposed lower copper-plated layer as a seed layer.

In accordance with embodiments, a semiconductor device may include at least one of the following: a semiconductor substrate; a first inter metal dielectric (IMD) layer formed over the semiconductor substrate; a first damascene structure formed in the first IMD layer exposing a portion of the semiconductor substrate; a first copper-plated layer formed over the first IMD layer and filling the first damascene structure; a second IMD layer formed over the first copper-plated layer; a second damascene structure formed in the second IMD layer exposing the first copper-plated layer; a second copper-plated layer formed over the second IMD layer and filling the second damascene structure such that the second copper-plated layer is formed by an electroplating process using the exposed first copper-plated layer as a seed layer.

In accordance with embodiments, a semiconductor device may include at least one of the following: at least one first inter metal dielectric (IMD) layer having a first aperture formed on and/or over a semiconductor substrate; a first copper-plated layer formed on and/or over the first IMD layer and inside the first aperture; at least one second IMD layer having a second aperture exposing the first copper-plated layer formed on and/or over the first copper-plated layer; and a second copper-plated layer formed on and/or over the second IMD layer and inside the second aperture by an electroplating process that uses the exposed first copper-plated layer as a seed layer.

DRAWINGS

FIG. 1 illustrates a method for manufacturing a semiconductor device.

Example FIGS. 2A to 2I illustrate a method for manufacturing a semiconductor device in accordance with embodiments.

DESCRIPTION

Reference will now be made in detail to a method for manufacturing semiconductor devices of a preferred embodiment of the present invention, examples of which are illustrated in the accompanying drawings. Wherever possible, the same reference numbers will be used throughout the drawings to refer to the same or like parts.

Figure 2A:
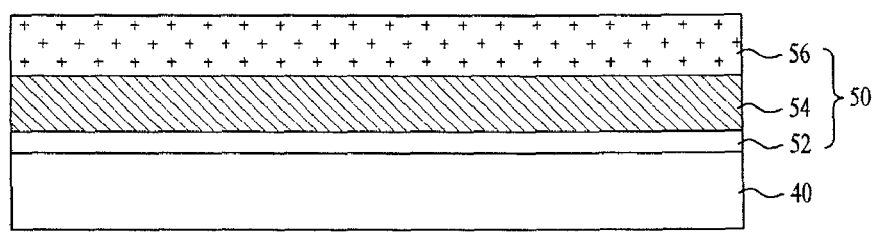

As illustrated in example FIG. 2A, at least one first inter metal dielectric (IMD) layer 50 is formed on and/or over a semiconductor substrate 40. Reference numeral 40 may alternatively represent a transistor or lower metal layer provided on and/or over a semiconductor substrate. Thus, although the following is based on the assumption that reference numeral 40 represents a semiconductor substrate, embodiments are not limited thereto. First IMD layer 50 may include a single layer or a plurality of layers. For example, first IMD layer 50 may include first undoped silicate glass (USG) layer 52, first fluorosilicate glass (FSG) layer 54 and second USG layer 56. However, embodiments are not limited to thereto, and first IMD layer 50 may be composed of a low-k material, ultra low-k material, porous material, or the like.

Figure 2B:
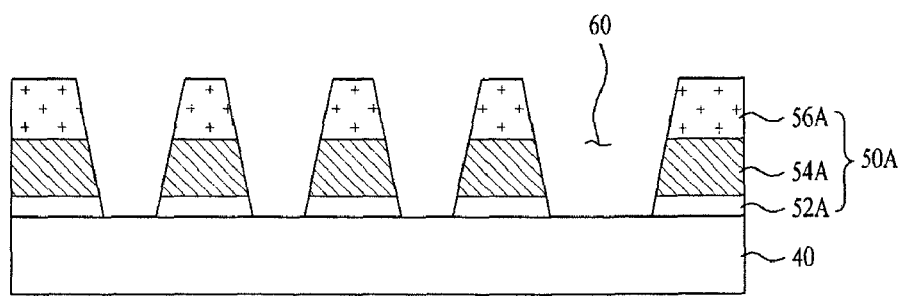
Figure 2B:
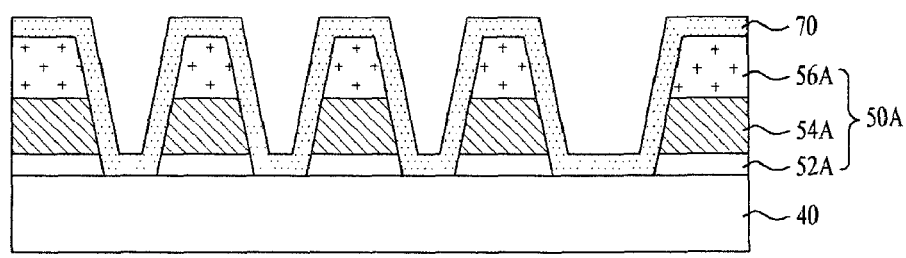

As illustrated in example FIG. 2B, first IMD layer 50 may be formed with a plurality of first apertures 60 using photolithography and etching processes. For example, first apertures 60 may be formed by forming a photoresist pattern on and/or over first IMD layer 50 to expose regions in the underlying semiconductor substrate 40 corresponding to first apertures 60 and etching first IMD layer 50 using the photoresist pattern as an etching mask. Here, reference numerals 52A, 54A, and 56A represent the etched first USG layer 52, first FSG layer 54, and second USG layer 56 respectively.

As illustrated in example FIG. 2C, first metal-diffusion-preventing layer 70 is formed on and/or over first IMD layer 50A and semiconductor substrate 40 and inside first apertures 60. First metal-diffusion-preventing layer 70 serves to prevent copper atoms of a first copper-plated layer 80A, which will be formed later, from being diffused into first IMD layer 50A. First metal-diffusion-preventing layer 70 may be composed of conductive materials, such as at least one of tantalum (Ta), tantalum nitride (TaN), titanium (Ti), titanium nitride (TiN), tantalum nitride (TaN)/tantalum (Ta), titanium silicon nitride (TiSiN), tungsten nitride (WN), titanium zirconium nitride (TiZrN), titanium (Ti)/titanium nitride (TiN), etc.

Figure 2D:
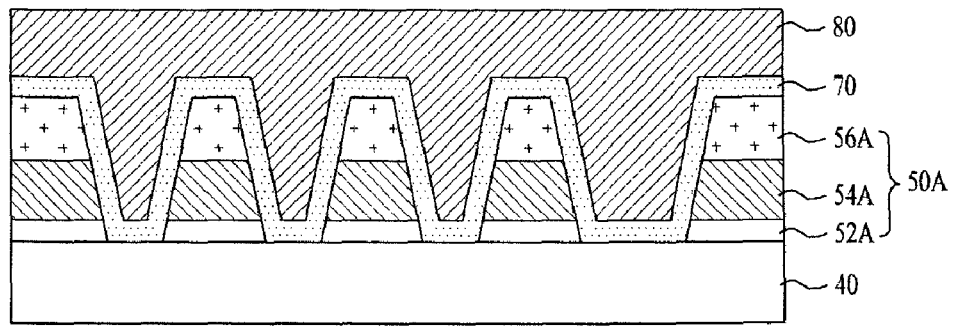

As illustrated in example FIG. 2D, first copper-plated layer 80 is then formed on and/or over first metal-diffusion-preventing layer 70 and inside first apertures 60 by an electroplating process. For example, first copper-plated layer 80 may be formed by depositing a copper seed layer on and/or over first metal-diffusion-preventing layer 70 via physical vapor deposition (PVD) or chemical vapor deposition (CVD), and immersing the resultant in an electrolyte.

Figure 2E:
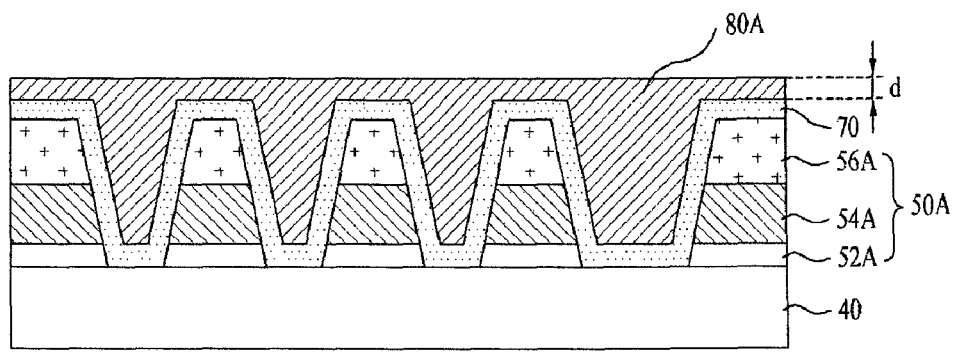

As illustrated in example FIG. 2E, first copper-plated layer 80 may then be planarized by chemical mechanical planarization (CMP) such that only a portion of first copper-plated layer 80A corresponding to a predetermined thickness d remains on and/or over the uppermost surface of first IMD layer 50A. For example, the predetermined thickness d may be within a range of between 50 Å to 150 Å.

Figure 2F:
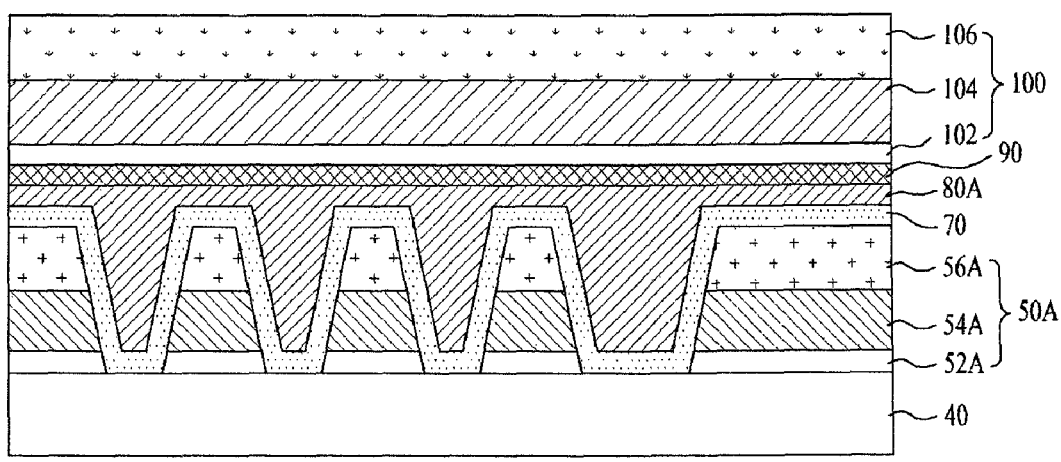

As illustrated in example FIG. 2F, at least one second IMD layer 100 is then formed on and/or over first copper-plated layer 80A. Alternatively, second IMD layer 100 may be formed on and/or over first copper-plated layer 80 illustrated in example FIG. 2D rather than on and/or over the planarized first copper-plated layer 80A illustrated in example FIG. 2E. Second IMD layer 100 may include a single layer or a plurality of layers. For example, second IMD layer 100 may include third USG layer 102, second FSG layer 104, and fourth USG layer 106. However, embodiments are not limited thereto, and second IMD layer 100 may be composed of a low-k material, ultra low-k material, porous material, or the like. Prior to forming second IMD layer 100 on and/or over first copper-plated layer 80A, etching-stop layer 90 may be formed on and/or over first copper-plated layer 80A. Etching-stop layer 90 may be composed of nitride material such as silicon nitride (SiN). In this case, second IMD layer 100 may be formed on and/or over etching-stop layer 90.

Figure 2G:
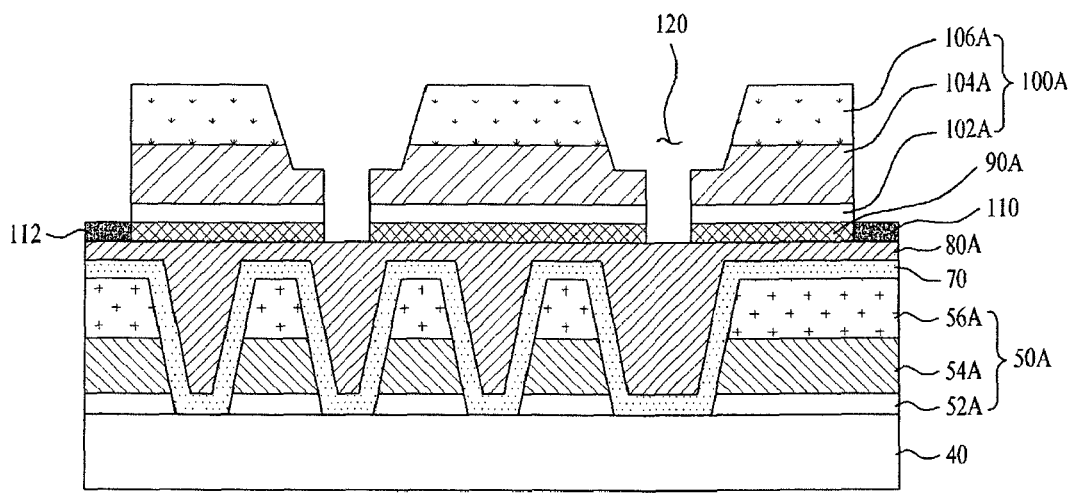

As illustrated in example FIG. 2G, second IMD layer 100 is then formed with a plurality of second apertures 120 to expose the uppermost surface of first copper-plated layer 80A. For example, second apertures 120 may be formed by a single or dual damascene process. A method for forming trenches and via-holes (or contact holes) as second apertures 120 using the damascene process is well known and thus, a detailed description thereof will be omitted herein. Etching-stop layer 90 is utilized as an etching end point during photolithography and etching processes for formation of second apertures 120. Here, reference numerals 102A, 104A, and 106A represent the etched third USG layer 102, second FSG layer 104, and fourth USG layer 106 respectively.

As illustrated in example FIG. 2G, among certain portions of first copper-plated layer 80A exposed through second apertures 120, at least one metal pad 110, 112 may be formed thereon and/or thereover. For instance, metal pad 110, 112 may be formed on and/or over at least one portion of first copper-plated layer 80A located at the edge of semiconductor substrate 40.

Figure 2H:
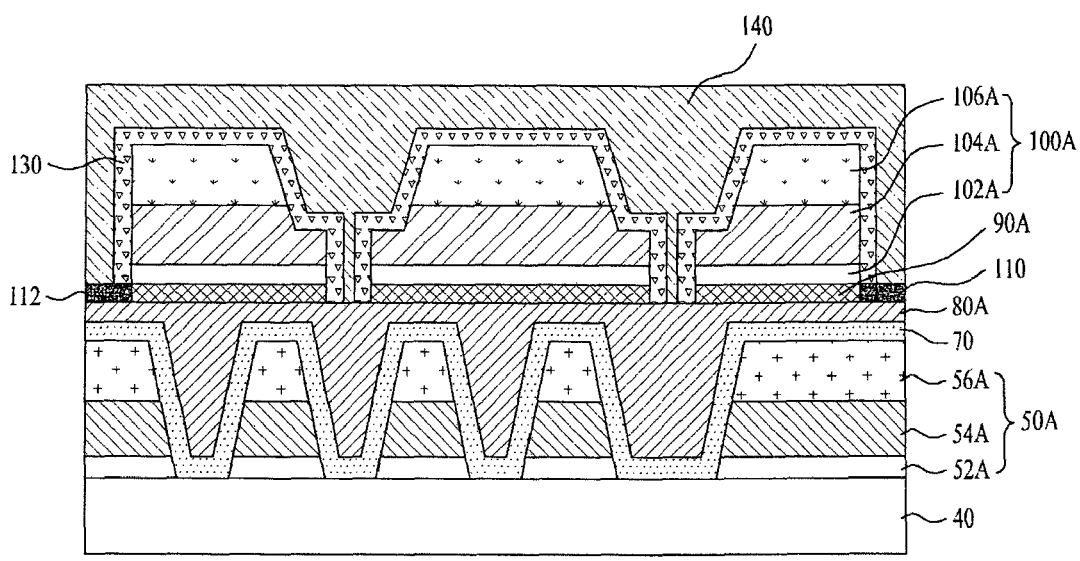

As illustrated in example FIG. 2H, second metal-diffusion-preventing layer 130 is formed on and/or over second IMD layer 100A and inside second apertures 120. In this case, second metal-diffusion-preventing layer 130 does not completely cover metal pad 110, 112 and the exposed first copper-plated layer 80A. Second metal-diffusion-preventing layer 130 serves to prevent copper atoms of second copper-plated layer 140, which will be formed later, from being diffused into second IMD layer 100A. Second metal-diffusion-preventing layer 130 may be composed of conductive materials, such as tantalum (Ta), tantalum nitride (TaN), titanium (Ti), titanium nitride (TiN), tantalum nitride (TaN)/tantalum (Ta), titanium silicon nitride (TiSiN), tungsten nitride (WN), titanium zirconium nitride (TiZrN), titanium (Ti)/titanium nitride (TiN), etc.

Second copper-plated layer 140 is then formed on and/or over second metal-diffusion-preventing layer 130 and inside second apertures 120 by an electroplating process using the exposed first copper-plated layer 80A as a seed layer. In this case, the at least one of metal pad 110, 112 comes into contact with electroplating pins during the electroplating process. If another copper-plated layer is subsequently formed on and/or over second copper-plated layer 140, second copper-plated layer 140 may be planarized, thus leaving behind a portion of second copper-plated layer 140 corresponding to a predetermined thickness from an uppermost surface of second IMD layer 100A. The predetermined thickness may be within a range of between 50 Å to 150 Å. However, if another copper-plated layer is not formed on and/or over second copper-plated layer 140, second copper-plated layer 140 may be planarized until the upper surface of second IMD layer 100A is exposed.

Figure 2I:
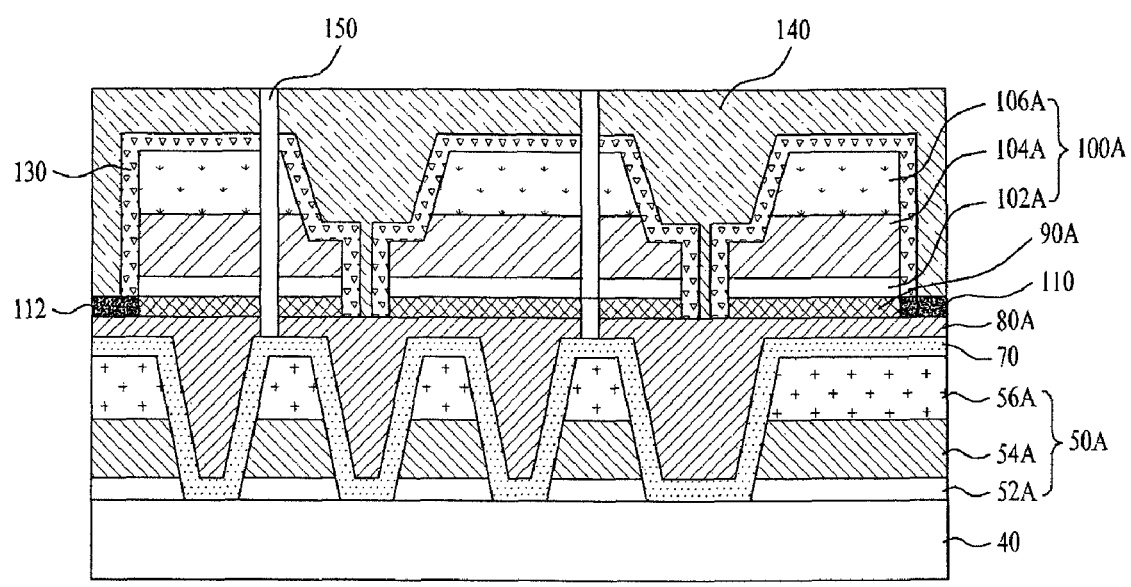

As illustrated in example FIG. 2I, metal barrier 150 may further be formed by photolithography and etching processes, to divide first copper-plated layer 80A and/or second copper-plated layer 140 into sections.

Therefore, a semiconductor device is formed including at least one first IMD layer 50A formed on and/or over semiconductor substrate 40. First IMD layer 50A may have a plurality of first apertures 60. First metal-diffusion-preventing layer 70 is formed on and/or over first IMD layer 50A and semiconductor substrate 40 and inside first apertures 60. First copper-plated layer 80A is formed on and/or over first metaldiffusion-preventing layer 70. Etching-stop layer 90 is formed over the first copper-plated layer 80A, and the at least one second IMD layer 100A is formed on and/or over etching-stop layer 90. Second IMD layer 100A has a plurality of second apertures 120 exposing first copper-plated layer 80A. At least one metal pad 110, 112 is formed on and/or over first copper-plated layer 80 exposed on and/or over the edge of semiconductor substrate 40. Second metal-diffusion-preventing layer 130 is formed on and/or over second IMD layer 100A except for portions of metal pad 110, 112 and the exposed first copper-plated layer 80A. Second copper-plated layer 140 is formed on and/or over second metal-diffusion-preventing layer 130, metal pad 110 and 112, and the exposed portions of first copper-plated layer 80A by an electroplating process that uses first copper-plated layer 80A as a seed layer. Additionally, metal barrier 150 may further be formed to divide first copper-plated layer 80A and/or second copper-plated layer 140.

As apparent from the above description, embodiments provide a semiconductor device and a method for manufacturing the same that forms an upper copper-plated layer in a fast, yet simple electroplating process using a lower copper-plated layer as a copper seed layer without deposition of a separate copper seed layer. As the upper copper-plated layer is formed in a bottom-up manner using the previously formed lower copper-plated layer as a seed layer, gap filling copper from the bottom to the top regardless of a hole size is possible, eliminating a design rule effect and providing superior gap-filling characteristics. In particular, this is more effective when gap-filling copper in a deep via-hole used in System In Package (SIP) technology, etc.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming at least one first inter metal dielectric (IMD) layer over a semiconductor substrate; and then
   forming a first aperture in the first IMD layer to expose the semiconductor substrate; and then
   forming a first copper-plated layer over the first IMD layer and in the first aperture; and then
   forming at least one second IMD layer over the first copper-plated layer; and then
   forming a second aperture in the second IMD layer to expose the first copper-plated layer; and then
   forming a second copper-plated layer over the second IMD layer and in the second aperture by performing an electroplating process using the exposed first copper-plated layer as a seed layer; and forming at least one metal pad over the exposed portion of the first copper-plated layer located at the edge of the semiconductor substrate, wherein the metal pad comes into contact with at least one electroplating pin during the electroplating process.

2. The method of claim 1, further comprising, after forming the first aperture and before forming the first copper-plated layer:
   forming a first metal-diffusion-preventing layer over the first IMD layer and in the first aperture,
   wherein the first copper-plated layer is formed over the first metal-diffusion-preventing layer.

3. The method of claim 2, further comprising, after forming the second aperture and before forming the second copper-plated layer:
   forming a second metal-diffusion-preventing layer over the second IMD layer and in the second aperture,
   wherein the second copper-plated layer is formed over the second metal-diffusion-preventing layer and the exposed portion of the first copper-plated layer.

4. The method of claim 1, further comprising, after forming the first copper-plated layer and before forming the at least one second IMD layer:
   planarizing the first copper-plated layer such that a portion of the first copper-plated layer has a predetermined thickness over the uppermost surface of the first IMD layer.

5. The method of claim 4, wherein the predetermined thickness is in a range of between 50 Å to 150 Å.

6. The method of claim 1, further comprising, after forming the first copper-plated layer and before forming the at least one second IMD layer:
   forming an etch-stop layer over the first copper-plated layer,
   wherein the second IMD layer is formed over the etch-stop layer.

7. The method of claim 1, further comprising, after forming the second copper-plated layer:
   planarizing the second copper-plated layer such that a portion of the first second copper-plated layer has a predetermined thickness over the uppermost surface of the second IMD layer.

8. The method of claim 1, further comprising, after forming the second copper-plated layer:
   planarizing the second copper-plated layer until the uppermost surface of the second IMD layer is exposed.

9. A method of manufacturing a semiconductor device comprising:
   forming a lower inter metal dielectric (IMD) layer over a semiconductor substrate; and then
   forming a lower damascene structure in the first IMD layer to expose the semiconductor substrate; and then
   forming a lower metal-diffusion-preventing layer over the uppermost surface of the lower IMD layer, the uppermost surface of the semiconductor substrate and sidewalls of the lower damascene structure; and then
   forming a lower copper-plated layer over the lower metal-diffusion-preventing layer and filling the lower damascene structure; and then planarizing the lower copper-plated layer such that a portion of the lower copper-plated layer has a predetermined thickness over the uppermost surface of the lower IMD layer; and then
   forming an upper IMD layer over the planarized lower copper-plated layer; and then
   forming an upper damascene structure in the upper IMD layer to expose the lower copper-plated layer; and then
   forming an upper metal-diffusion-preventing layer over the uppermost surface of the upper IMD layer and sidewalls of the upper damascene structure such that a portion of the uppermost surface of the lower copper-plated layer corresponding to the upper damascene structure is exposed; and then
   forming an upper copper-plated layer over the upper IMD layer and filling the upper damascene structure by performing an electroplating process using the exposed lower copper-plated layer as a seed layer; and forming at least one metal pad and over the exposed portion of the lower copper-plated layer located at the edge of the semiconductor substrate, wherein the at least one metal pad comes into contact with at least one electroplating pin during the electroplating process.

10. The method of claim 9, wherein the lower IMD layer and the upper IMD layer each comprise a multi-layer structure.

11. The method of claim 10, wherein the multi-layer structure comprises a first undoped silicate glass layer, a fluorosilicate glass layer and a second undoped silicate glass layer.

12. The method of claim 9, wherein the lower metal-diffusion-preventing layer and the upper metal-diffusion-preventing layer each comprise at least one of tantalum (Ta), tantalum nitride (TaN), titanium (Ti), titanium nitride (TiN), tantalum nitride (TaN)/tantalum (Ta), titanium silicon nitride (TiSiN), tungsten nitride (WN), titanium zirconium nitride (TiZrN) and titanium (Ti)/titanium nitride (TiN).

13. The method of claim 9, wherein the lower damascene structure and the upper damascene structure each comprise one of a single damascene structure and a dual damascene structure.

14. The method of claim 9, wherein the predetermined thickness is in a range of between 50 Å to 150 Å.

15. A semiconductor device comprising:
a semiconductor substrate;
a first inter metal dielectric (IMD) layer formed over the semiconductor substrate;
a first damascene structure formed in the first IMD layer exposing a portion of the semiconductor substrate;
a first copper-plated layer formed over the first IMD layer and filling the first damascene structure;
a second IMD layer formed over the first copper-plated layer;
a second damascene structure formed in the second IMD layer exposing the first copper-plated layer;
a second copper-plated layer formed over the second IMD layer and filling the second damascene structure, wherein the second copper-plated layer is formed by an electroplating process using the exposed first copper-plated layer as a seed layer; and
a metal barrier formed extending through the second copper-plated layer, the second IMD and the first copper-plated layer to divide the first copper-plated layer and/or second copper-plated layer into sections.

16. The semiconductor device of claim 15, further comprising a first metal-diffusion-preventing layer formed over the first IMD layer, the semiconductor substrate and the first damascene structure, wherein the first copper-plated layer is formed over the first metal-diffusion-preventing layer.

17. The semiconductor device of claim 15, further comprising a second metal-diffusion-preventing layer formed over the second IMD layer and the second damascene structure such that a portion of the uppermost surface of the first copper-plated layer corresponding to the second damascene structure is exposed.

18. The semiconductor device of claim 15, further comprising an etch-stop layer formed over the first copper-plated layer, wherein the second IMD layer is formed over the etch-stop layer.

* * * * *